United States Patent
Uibel et al.

(10) Patent No.: US 9,625,213 B2
(45) Date of Patent: Apr. 18, 2017

(54) SILICON-NITRIDE-CONTAINING SEPARATING LAYER HAVING HIGH HARDNESS

(75) Inventors: Krishna Uibel, Waltenhofen (DE); David W. Worthey, Monroe, GA (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 396 days.

(21) Appl. No.: 14/342,001

(22) PCT Filed: Aug. 2, 2012

(86) PCT No.: PCT/EP2012/065182
§ 371 (c)(1),
(2), (4) Date: May 29, 2014

(87) PCT Pub. No.: WO2013/029920
PCT Pub. Date: Mar. 7, 2013

(65) Prior Publication Data
US 2014/0272748 A1    Sep. 18, 2014

Related U.S. Application Data

(60) Provisional application No. 61/529,552, filed on Aug. 31, 2011.

(51) Int. Cl.
| | | |
|---|---|---|
| *B32B 17/06* | (2006.01) | |
| *B32B 18/00* | (2006.01) | |
| *F27B 14/10* | (2006.01) | |
| *C30B 11/00* | (2006.01) | |
| *C30B 15/10* | (2006.01) | |
| *C30B 35/00* | (2006.01) | |
| *C23C 18/12* | (2006.01) | |
| *H01L 31/18* | (2006.01) | |

(52) U.S. Cl.
CPC .......... *F27B 14/10* (2013.01); *C23C 18/1204* (2013.01); *C23C 18/127* (2013.01); *C23C 18/1212* (2013.01); *C23C 18/1275* (2013.01); *C30B 11/002* (2013.01); *C30B 15/10* (2013.01); *C30B 35/002* (2013.01); *H01L 31/182* (2013.01); *F27B 2014/104* (2013.01); *Y02E 10/546* (2013.01); *Y02P 70/521* (2015.11)

(58) Field of Classification Search
USPC ....... 428/426, 428, 688, 689, 698, 699, 701, 428/702, 704
See application file for complete search history.

(56) References Cited

U.S. PATENT DOCUMENTS

| | | | | |
|---|---|---|---|---|
| 2007/0089642 | A1* | 4/2007 | Engler | C09D 1/00 106/401 |
| 2007/0240635 | A1* | 10/2007 | Rancoule | C30B 15/10 117/208 |
| 2008/0260608 | A1* | 10/2008 | Rancoule | C04B 35/584 422/245.1 |
| 2009/0119882 | A1* | 5/2009 | Uibel | B22D 41/02 23/295 R |

FOREIGN PATENT DOCUMENTS

| | | |
|---|---|---|
| CN | 101508590 A | 8/2009 |
| CN | 201857440 U | 6/2011 |
| DE | 102005050593 A1 | 4/2007 |
| DE | 102006003819 A1 | 8/2007 |
| DE | 102007053284 A1 | 5/2009 |
| JP | H07-017728 A | 1/1995 |
| JP | 2011507981 A | 3/2011 |
| WO | 2007/039310 A1 | 4/2007 |

OTHER PUBLICATIONS

Machine translation of CN101508590A.*
Machine translation of CN201857440U.*
Hide, I. et al., "Mould shaping silicon crystal growth with a mould coating material by the spinning method", Journal of Crystal Growth, vol. 79, No. 1-3, pp. 583-589, Dec. 2, 1986.
Shao, et al., "Enamel", China Light Industry Press, Version 1, Feb. 1983, pp. 30-32 and 38, English Abstract attached.

* cited by examiner

Primary Examiner — Lauren R Colgan
(74) Attorney, Agent, or Firm — C. Michael Geise

(57) ABSTRACT

The invention relates to a shaped body comprising a substrate with a firmly adhering separating layer, wherein the separating layer comprises 92-98 wt. % silicon nitride ($Si_3N_4$) and 2-8 wt. % silicon dioxide ($SiO_2$) and wherein the separating layer has a total oxygen content of ≤8 wt. % and a hardness of at least 10 HB 2.5/3 according to DIN EN ISO 6506-1.

8 Claims, No Drawings

SILICON-NITRIDE-CONTAINING SEPARATING LAYER HAVING HIGH HARDNESS

This is a National Phase Application filed under 35 U.S.C. 371 as a national stage of PCT/EP2012/065182, filed Aug. 2, 2012, which claims priority benefit under 35 USC 119(e) from U.S. Provisional Patent Application No. US 61/529,552, filed Aug. 31, 2011, the content of each of which is hereby incorporated by reference in its entirety.

TECHNICAL FIELD

The present invention relates to a shaped body comprising a substrate with a firmly adhering silicon-nitride-containing separating layer which is abrasion-resistant, impact-resistant and scratch-resistant as well as thermally stable so that the shaped body is stable during transport, a process for producing such a shaped body, a coating suspension for use in such a process and the use of such shaped bodies in the field of corrosive nonferrous metal melts, in particular as crucibles for use in solar silicon processing.

BACKGROUND OF THE INVENTION

Crucibles made of graphite or of silicon nitride but principally of $SiO_2$ (fused silica) are used for melting and for recrystallization of silicon blocks (ingots) of silicon grains, silicon granules or silicon pieces. By means of exactly defined cooling processes, ingots having the desired structures and purities crystallize out from the melt, these ingots are then cut into thin disks and form the active component of photovoltaic systems.

It is essential here that as a result of the materials used in the processing such as crucibles, the solar silicon quality is not negatively influenced and the silicon melts solidify free from defects and can be removed from the crucible undisturbed. In this context, it is important to prevent the corrosive attack of liquid silicon metal on the crucible material since the melt would otherwise be contaminated. Furthermore, adhesions, infiltration and diffusions lead to problems during removal of the ingots so that there is a risk of a cracking or splitting of the polycrystalline silicon block.

As a result of the corrosive silicon melt, the $SiO_2$ crucible is attacked since a chemical reaction takes place between Si and $SiO_2$ to form volatile SiO. In addition, oxygen and undesired impurities from the crucible material enter into the silicon melt in this way.

In particular, adhesions of the solidifying or solidified silicon block should be avoided at all costs since the silicon undergoes very large thermal expansions where the smallest adhesions lead to mechanical stress and thus to rupture of the crystalline structure, which means rejects of silicon material.

PRIOR ART

Known from EP 963 464 B1 are crucibles made of quartz, graphite or ceramic provided with silicon nitride layers to avoid adhesions between crucible and nonferrous metals following contact of the crucible with solidifying nonferrous metal melts such as silicon melts, where the layers consist of a high-purity silicon nitride power. These powder coatings are applied directly by the user before using the crucible and are produced by dispersing highly pure silicon nitride powder in a solvent and then applied, for example, by spraying the suspension onto the crucible. The solvent and optionally used organic binder components must be removed by thermal after-treatment. The silicon nitride layers of EP 963 464 B1 are powdery and have the disadvantage that they are not touch-proof and are not mechanically stable. The layers have a low hardness and their adhesive strength on the crucible substrate is poor. As a result of the poor mechanical properties, the layers have the disadvantage that they are not stable during transport and therefore can only be applied at the end user (see [0009] in WO 2007/039310 A1). Furthermore, the layers are disadvantageous in that silicon nitride is carried over into the silicon ingot, and during loading with the silicon pieces, defects can form in the coating.

In order to eliminate these problems, WO 2007/039310 A1 proposes a crucible having a coating consisting of 80 to 95 wt. % of silicon nitride and 5 to 20 wt. % of a mineral low-temperature binder, where the total acid content of the coating lies in the range of 5 to 15 wt. %. The low-temperature binder preferably comprises a $SiO_2$-based binder but silicon oxynitride can also be used. The mineral low-temperature binder can, however, also be a sol gel binder or an organometallic compound based on silicon chemistry or can consist of $SiO_2$ nanoparticles. The coatings are baked at temperatures below 800° C. and preferably below 500° C. in order to keep oxidation of the silicon nitride low. The layers have a low hardness and only a low adhesive strength. In addition, the layers are powdery and not touch-proof. The oxygen content of the coating ready for use is 5 to 15 wt. %, preferably 8 to 12 wt. %.

In DE 10 2005 050 593 A1 a skim coat of silicon nitride and a binder are described to produce a durable hard coating, where the binder consists of nanoscale solid particles and/or precursors thereof from the production by means of a sol gel process. The layers which can be produced from this have a better adhesive strength and a higher hardness than the previously described coatings. Furthermore, the layers are not powdery and are touch-resistant. These layers are disadvantageous in that for most applications depending on the raw silicon used and the respective process conditions, they have a too-high oxygen content of more than 10 wt. %. The theoretical oxygen content is higher but is not reached as a result of vaporisation and diffusion of the binder into the substrate material.

In the coating methods described in WO 2007/039310 A1 and DE 10 2005 050 593 A1, sols or ceramic precursors (such as salts or metallorganic compounds) of $SiO_2$ are used whether activated (for example, with acid, base and/or water) or inactivated. It has been shown however that with these coating agents, this unavoidably results in the formation of defects in the coating.

The layer defects which occur in the coatings such as cracks perpendicular to the layer surface and in particular the "chipping" (flaky splintering of the coating in the entire depth including possibly of crucible material) have the effect that during ingot production adhesions of silicon can occur on the crucible material. The "chipping" is formed by cracks in the region of the contact zone of coating and substrate which lead to a local detachment of the coating. This can result in adhesions of the metal melt on the crucible wall during use of the crucible, and these can be further intensified when infiltration of the coating through the metal melt occurs. The adhesions of silicon on the crucible material are formed in particular during the process phase in which the silicon in the crucible is liquid. The greater the adhesion or the more adhesions are formed, the greater the risk of cracks forming in the ingot during solidification which reduces the yield of usable silicon for solar cell production.

The layer defects are largely avoided by the coatings proposed in DE 10 2007 053 284 A1. DE 10 2007 053 284

A1 proposes a slip for producing a durable, firmly adhering separating layer on a substrate comprising a suspension of solid particles, where the solid particles comprise 67-95 wt. % silicon nitride and 5-33 wt. % of an $SiO_2$-based high-temperature binder, where the $SiO_2$-based high-temperature binder is derived from $SiO_2$ precursors and is pre-treated by thermal treatment in a temperature range of 300-1300° C. The thermal treatment of high-temperature binder preferably takes place together with the silicon nitride so that the silicon nitride and the high-temperature binder are present in the coating suspension and the ready-to-use coating as mixed granules.

The coatings disclosed in DE 10 2007 053 284 A1 have oxygen contents of 6-18 wt. %. In addition to the high oxygen content of the coatings, DE 10 2007 053 284 A1 is also disadvantageous in that here initially granules of binder and silicon nitride must be produced and these must then be subjected to a thermal treatment at 300 to 1300° C. before the coating suspension can be produced so that the method for producing these coatings is overall very complex.

OBJECT OF THE INVENTION

It is therefore the object of the invention to provide a shaped body comprising a substrate with a firmly adhering separating layer, which separating layer is particularly suitable for applications in the area of solar silicon processing without having the disadvantages known in the prior art, in particular which makes it possible to achieve defect-free coatings having high abrasion strength. In addition, a simple and cost-effective method for producing such a shaped body and a coating suspension for used in such a method are to be provided.

SUMMARY OF THE INVENTION

The aforesaid object is solved by a shaped body comprising a substrate having a firmly adhering separating layer, a method for producing the shaped body, a coating suspension for use in such a method, and the use of the shaped body in the field of corrosive nonferrous metal melts.

The subject matter of the invention is therefore a shaped body comprising a substrate having a firmly adhering separating layer, wherein the separating layer comprises 92-98 wt. % silicon nitride ($Si_3N_4$) and 2-8 wt. % silicon dioxide ($SiO_2$) and wherein the separating layer has a total oxygen content of ≤8 wt. % and a hardness of at least 10 HB 2.5/3 according to DIN EN ISO 6506-1.

The subject matter of the invention is furthermore a method for producing a shaped body according to the invention, comprising the steps:
a) preparing a coating suspension comprising $Si_3N_4$ and an $SiO_2$-based binder as well as a dopant in the form of a flux for producing a firmly adhering separating layer
b) providing a substrate
c) applying the coating suspension to the substrate and
d) hardening the applied coating suspension by baking at an elevated temperature to form a firmly adhering separating layer.

The coating suspension in step a) comprises a suspension of solid particles and the dopant, where the solid particles comprise 88-98 wt. % silicon nitride and 2-12 wt. % of a $SiO_2$-based binder. The $SiO_2$-based binder suitably consists of particulate $SiO_2$ and/or of compounds which form $SiO_2$ by baking at temperatures of ≥300° C. The quantitative information on the $SiO_2$-based binder relate to the contents resulting after thermal treatment or pyrolysis of the binder at ≥300° C.

The subject matter of the invention is also a coating system for use in the production of a shaped body according to the invention, comprising a suspension of solid particles and a dopant in the form of a flux in a dispersing medium, wherein the solid particles comprise 88-98 wt. % of $Si_3N_4$ and 2-12 wt. % of an $SiO_2$-based binder.

The subject matter of the invention is furthermore the use of a shaped body according to the invention in the field of corrosive nonferrous metal melts, in particular the use of a shaped body in the form of a crucible to produce silicon melts.

It has surprisingly been shown that particularly hard layers having high adhesive strength with low oxygen contents and low binder contents can be achieved with the method according to the invention.

Coatings having a low overall oxygen content are therefore preferred because at high oxygen contents the diffusion of oxygen into the semiconductor (the silicon ingot) is high and less high-quality semiconductor material, in particular fewer high-quality silicon ingots and therefore fewer high-quality silicon wafers can be produced for the manufacture of solar cells.

Compared with the coatings of DE 10 2005 050 593 A1, DE 10 2007 053 284 A1 and WO 2007/039310 A1 it was thus possible to overcome the disadvantage that too much oxygen enters into the silicon ingot during the production of solar silicon. As a result, the yield of high-quality low-oxygen silicon from ingot production is increased and the efficiency of the solar cells increases.

It is particularly surprising that the dopant vaporises completely or approximately free from residue above 1000° C. whilst the unexpected effects of the dopant, i.e. to relieve the stresses in the separating layer, to produce good adhesion to the substrate and to increase the hardness, are retained even without the presence, or with only low residual contents, of the dopant.

It is also particularly surprising here that dopants known from glass manufacture and processing, which are used there in contents of a few percent, are also effective as dopants here in the ppm range. In the area of glass manufacture and processing, the flux remains in the glass as far as the end product whereas in the coatings or separating layers according to the invention it can be transient for the most part during the baking process.

Furthermore, despite the low binder fraction and the low oxygen content in the coating, unlike the coatings of EP 963 464 B1, touch-proof layers which are stable during transport can be produced in which defect formation does not occur when loading with silicon pieces. Unlike the layers of WO 2007/039310 A1 and EP 963 464 B1, the layers according to the invention are not powdery.

The separating layers according to the invention are characterised compared with all the previously described coatings (DE 10 2005 050 593 A1, DE 10 2007 053 284 A1, EP 963 464 B1 and WO 2007/039310 A) by a higher hardness with the same or lower binder and oxygen contents.

The separating layers according to the invention have a good adhesive strength to the substrate.

The good layer properties lead to exceptional process-relevant properties during the production of the silicon ingot:

As a result of the non-powdery layer, as in the layers of DE 10 2005 050 593 A1 and DE 10 2007 053 284 A1, there is no or only slight contamination of the silicon ingot by silicon nitride. Compared to the powdery coating according to EP 963 464 B1 and also WO 2007/039310 A1, the contamination of the Si ingot by silicon nitride in the coatings according to the invention is however significantly lower.

The coating is less sensitive to impact and in applications for crucibles enables easy piecewise loading of the coated crucible, furthermore the coating of large crucibles is also possible.

During loading of the crucible or during the fusing of broken silicon, damage to the coating can generally occur if inhomogeneities or defects in the coating have not already occurred during application or during baking. As a result of the low layer strength and lower adhesion to the substrate in the case of coatings according to EP 963464 B1 and WO 2007/039310 A1, layer removal as a result of impact, shear, scratching or frictional loading is high and a thin residual layer or no residual layer remains. However, the layers according to the invention are not damaged or are significantly less damaged by the mechanical stresses during loading. As a result of the higher hardness, the layers according to the invention are less damaged during loading than the layers of DE 10 2005 050 593 A1 and DE 10 2007 053 284 A1. If layer removal does take place however, this is significantly lower with the coatings according to the invention so that that the separating effect and function of the layer is ensured.

For the first time separating layers having high adhesive strength, and binder and total oxygen contents of <5 wt. % could now be obtained with the coatings according to the invention. In the layers known so far having low oxygen content according to EP 963464 B1 and WO 2007/039310 A1, the adhesive strength is inadequate (see [0019] in WO 2007/039310 A1 and Reference Example 3 as well as Comparative Examples 1 and 2).

The coating suspension according to the invention can be applied by the preferred methods of application, dipping, flooding and wet-on-wet spraying. These methods are therefore preferred because more homogeneous and denser layers can be produced thereby than in dry spraying (powder application). As a result of these application methods in the baked coatings the pore size in the coating is smaller and the adhesive strength, impact and scratch resistance increases compared with powder-applied layers. The coating is touch-proof and stable during transport and contamination of the ingot with layer components decreases significantly.

Due to the simplified application by means of flooding, the times for application of the coating to the crucible material are significantly reduced. Typically a spray application to produce powdery layers according to WO 2007/039310 A1 and EP 963 464 B1 on a solar crucible takes 20-50 minutes. With the coating suspension according to the invention application by means of flooding takes about 5-10 minutes. Application by spraying can also be accelerated, which typically takes 10-15 minutes for a standard crucible (e.g. having a base area of 690×690 $mm^2$ and wall areas of 690×400 $mm^2$).

DETAILED DESCRIPTION OF THE INVENTION

The separating layer according to the invention contains 92-98 wt. % silicon nitride ($Si_3N_4$) and 2-8 wt. % silicon dioxide ($SiO_2$), preferably 94-98 wt. % $Si_3N_4$ and 2-6 wt. % $SiO_2$ and particularly preferably >95-97 wt. % $Si_3N_4$ and 3-<5 wt. % ($SiO_2$).

In the separating layer according to the invention, the $SiO_2$ is a binder for the silicon nitride. The $SiO_2$ content of the separating layer can be determined by analysis of the total oxygen content of the coating and converting to $SiO_2$.

The total oxygen content of the separating layer is ≤8 wt. %, preferably <5 wt. %. The total oxygen content is composed of the oxygen of the $SiO_2$ binder, the oxygen unavoidably contained in the silicon nitride powder, and the oxygen content produced during baking of the coating by oxidation of the silicon nitride.

If the dopant contained in the coating suspension to produce the separating layers according to the invention does not vaporise completely free from residue during hardening of the coating suspension by baking, the separating layer can also contain a residual content of a dopant in the form of a flux.

The dopant in the form of a flux is preferably an alkali metal compound, more preferably a sodium compound. The fraction of the dopant, expressed as alkali metal content of the separating layer, is preferably up to 150 ppm, further preferably up to 50 ppm.

The hardness of the separating layer is at least 10 HB 2.5/3 according to DIN EN ISO 6506-1, preferably at least 15 HBW 2.5/3 and particularly preferably at least 20 HBW 2.5/3.

It is also possible to produce layers having a gradient in the oxygen content where the layer in contact with the semiconductor material such as for example solar silicon contains at most 8 wt. % of oxygen and preferably less than 5 wt. % of oxygen and at the same time has a hardness HBW 2.5/3 of at least 10.

The shaped body according to the invention can be produced by a method comprising the steps:
a) preparing a coating suspension comprising $Si_3N_4$ and an $SiO_2$-based binder as well as a dopant in the form of a flux for producing a firmly adhering separating layer
b) providing a substrate
c) applying the coating suspension to the substrate and
d) hardening the applied coating suspension by baking at an elevated temperature to form a firmly adhering separating layer.

The coating suspension in step a) preferably comprises a suspension of solid particles and the dopant, wherein the solid particles comprise 88-98 wt. % of silicon nitride and 2-12 wt. % of a $SiO_2$-based binder.

The silicon-nitride-containing coating suspension based on water or an organic dispersing medium contains preferably highly pure silicon nitride having a mean particle or agglomerate size ($d_{50}$) in the range of 0.5-20 μm, preferably of 1-5 μm and particularly preferably of 1.5-3 μm.

The $SiO_2$-based binder in the coating suspension is, for example, derived from substances or substance mixtures which contain or form silicon dioxide precursors or is already present as silicon dioxide particles or as a mixture of precursors of silicon dioxide particles and silicon dioxide particles and during pyrolysis at ≥300° C. form $SiO_2$ having a purity of >99.95%, preferably >99.99%. In the baked, ready-to-use coating there is thus a high-purity $SiO_2$ binder. In the coating suspension the $SiO_2$-based binder according to the invention is preferably present as a nanodisperse phase or as sol or as ceramic precursors or as mixtures thereof (precursor, monomer, fractal accumulations of monomers or polycondensate).

The coating suspension or the $SiO_2$-based binder in the coating suspension contains a dopant. The dopant is a flux for $SiO_2$. Fluxes generally reduce the melting point or the softening point of $SiO_2$ and reduce the glass transition temperature. Preferred are fluxes which particularly substantially reduce the melting point or the softening point of the $SiO_2$ and can achieve this with only low contents. Substances or substance mixtures which contain alkali metal compounds are preferably used as dopant, for example, alkali carbonates such as potassium or sodium carbonate or also sodium silicate or potassium silicate as well as combinations of such substances. Particularly preferably sodium compounds are used as dopant.

The content of the active component of the dopant such as the alkali metal content in alkali metal compounds, for example, of potassium in potassium carbonate or sodium in sodium silicate in the coating suspension ready for use is preferably between 30 and 500 ppm, further preferably between 50 and 400 ppm and particularly preferably between 80 and 300 ppm, where the quantitative details of the dopant are relative to the total solid content of the coating suspension after pyrolysis of the binder, i.e. the binder was taken into account when determining the total solid content as $SiO_2$.

It is preferred that the dopant is at least partially transient in a thermal treatment of the coating so that after baking of the coating or during use before the silicon begins to melt, said dopant is only partially present in the coating or has almost or completely disappeared. This prevents the dopant from being transported in undesired quantities as an impurity into the silicon ingot.

The dopant is added to the dispersing medium of the coating suspension and is preferably present there as an insoluble or barely soluble compound.

In the case of porous solar crucibles made of fused silica, a part of the binder is drawn into the crucible wall due to capillary forces and is thus no longer part of the coating. Likewise, when using $SiO_2$ precursors such as metallorganic compounds (such as, for example, tetraethyl orthosilicate and sol gel systems produced therefrom) low-molecular components can vaporise during drying of the layer so that the effective binder content in the coating is significantly lower than the binder content which is set in the formulation of the coating suspension.

The binding mechanism of the binder modified by adding the dopant differs from coatings in which a low-temperature binder known from the prior art is used. Proof of this is that neither the dopant alone nor the binder alone, together with silicon nitride powder, are capable of producing the functional silicon nitride layers according to the invention having low oxygen content and high hardness and adhesive strength (see Reference examples).

The binder modified by adding dopant differs significantly in its properties from the original undoped binder. By using the dopant with low binder contents at the same time, few stresses are formed in the separating layer with the result that significantly fewer defects occur in the substrate surface or in the separating layer both after the coating or after the baking and also during the process such as possibly so-called "chipping" (flaky splitting of the coating in the entire depth including possibly crucible material) or cracks and microcracks or the formation of entire crack networks. This is not achieved as in DE 10 2007 053 284 A1 by reducing the sintering activity, but by using the dopant which reduces the glass transition temperature. This already brings about at <400° C. a softening of dopant-rich regions in the coating and therefore a relaxation of stresses which can produce defects in the separating layer.

The coating suspension to produce the shaped body according to the invention with the silicon-nitride-containing separating layers can be produced by means of a method comprising the following process steps:
1) producing a pre-product A by mixing $SiO_2$-based binder raw materials, dispersing medium and the dopant,
2) producing the coating suspension by dispersion of silicon nitride powder and optional adjuvants in pre-product A.

It is possible to combine steps 1) and 2) and disperse the silicon nitride power jointly with binder raw materials, dopant and optionally adjuvants in a dispersing medium.

Another possible method of manufacture for the coating suspension which can be used, for example, when using a liquid dopant, comprises the following process steps:
1) producing a pre-product B by precipitating the dopant in the dispersing medium and dispersing silicon nitride powder in the doped dispersing medium by joint grinding,
2) producing the coating suspension by homogenisation of the pre-product B with the $SiO_2$-based binder raw materials and optionally adjuvants by joint grinding.

The binder raw materials in 1) or 2) of the aforesaid process variants are preferably precursors of the silicon dioxide or silicon nitride such as, for example, silicon organic compounds and hydrolysis products therefrom as well as condensation products thereof as well as mixtures of silicon organic compounds, hydrolysis and condensation products thereof which are produced by means of a sol-gel process and/or salts of silicon such as silicon tetrachloride, optionally with added silicon dioxide nanoparticles or silicon dioxide particles in the submicron range.

Examples for suitable silicon organic compounds are tetraethyl orthosilicate (TEOS) and methyltriethoxy silane (MTEOS). It is also possible to use only $SiO_2$ nanoparticles as binder raw materials without added silicon organic compounds. The mean particle size of the $SiO_2$ nanoparticles is preferably 100 nm and less, further preferably 50 nm and less.

The dopant in 1) preferably comprises an alkali metal compound, particularly preferably a sodium compound. For example, an alkali carbonate such as potassium or sodium carbonate can be used as dopant or also potassium or sodium silicate.

The dopant is added to the dispersing medium of the coating suspension and is preferably present there as an insoluble or barely soluble compound.

Preferably between 30 and 500 ppm, further preferably between 50 and 400 ppm and particularly preferably between 80 and 300 ppm of dopant is added, where the quantitative details of the dopant is relative to the total solid content of the coating suspension after pyrolysis of the binder, i.e. the binder has been taken into account when determining the total solid content as $SiO_2$.

Water and/or an organic solvent, for example, an alcohol such as ethanol can be used as the dispersing medium.

The mixing and the dispersing in step 1) or 2) can be carried out in a wet grinding or other mixing units.

Preferably a high-purity powder is used as silicon nitride powder in 2) or 1). The total content of metal impurities of the silicon nitride powder is preferably less than 100 ppm, particularly preferably less than 50 ppm. The oxygen content of the silicon nitride powder is preferably less than 2 wt. % and the total carbon content is preferably less than 0.35 wt. %. The mean particle or agglomerate size ($d_{50}$) of the silicon nitride powder preferably lies in the range of 0.5-20 µm, further preferably 1-5 µm and particularly preferably 1.5-3 µm.

The adjuvants in 2) can be organic compounds such as, for example, polyvinyl butyral (PVB), polyvinyl alcohol (PVA), polyethylene glycol (PEG), wax or ethanol-soluble polymers.

The solid content in the coating suspension is suitably 40 to 65 wt. % for application by flooding, 35 to 55 wt. % for application by wet-on-wet spraying.

The application of the suspension produced in step c) of the method for producing the shaped body according to the invention is accomplished by commonly used coating methods such as spraying (preferably wet on wet) or flooding on an inorganic substrate (such as, for example, fused silica).

The formation of the separating layer of the shaped body according to the invention in step d) suitably takes place by baking the coating at 300°-1300° C., preferably at 900° C.-1200° C., further preferably at 1000° C.-1100° C. in air or at low oxygen partial pressure, or in a reducing or inert atmosphere at 800°-1750° C., preferably at 1000° C.-1725° C., and further preferably at 1100° C.-1700° C. or at gas pressure (e.g. nitrogen, argon) at 1000°-2000° C., preferably at 1500° C.-1900° C., and further preferably at 1600° C.-1800° C. The heating and cooling time is, for example, 8 hours in each case, the holding time at maximum temperature is preferably about one hour. Baking of the coating in a gas-fired furnace at low oxygen partial pressure is preferred since the silicon nitride in the coating is then less strongly oxidized.

The use of highly pure initial chemicals (silicon nitride powder, silicon organic compounds, alcohols etc.) is preferred since extremely pure layers can be obtained in this case which in particular meet the requirements of the solar industry.

In the shaped bodies according to the invention, the substrate suitably consists of ceramic, including silicon nitride ceramic or $SiO_2$ (fused silica) or also fibre mats or fabric. In a preferred embodiment the shaped body comprises a crucible having a substrate of $SiO_2$ (fused silica) which is suitable for the processing of corrosive nonferrous metal metals, in particular silicon melts.

EXAMPLES AND COMPARATIVE EXAMPLES

Brinell Hardness Measurement:
The hardness of the coatings is determined herein as Brinell hardness according to DIN EN ISO 6506-1, using a ball diameter of 2.5 mm and a load of 3 kg.
Peeling Test (Adhesive Strength):
The adhesive strength was determined by measuring the force required to peel off a plate glued to the baked coating of a coated sample (adhesive area 500 mm$^2$). The plate was glued using a two-component epoxy resin adhesive which as a result of its high viscosity penetrates a maximum of 50-80 μm into the coatings. The adhesive strength was determined perpendicular to the layer surface in N/mm$^2$. The layer thickness of the tested coated samples was between 150 and 250 μm.
Determination of Total Oxygen Content and Sodium Content of the Coating:
The coatings were removed using a silicon nitride scraper and the powder thus obtained was used for the analysis without drying, The total oxygen content was determined by means of carrier gas hot extraction. The sodium content was determined by means of optical emission spectrometry with inductively coupled plasma and electrothermal vaporization (ETV-ICP OES).

Comparative Example 1

Standard Suspension 50 wt. % of silicon nitride powder (UBE E10) is homogenized in ethanol. The suspension is applied to the cleaned, dust-free dry fused silica crucible. Coating of the crucible by means of flooding is not possible since cracks are already formed in the coating from a layer thickness of 150-200 μm during drying which results in a flat detachment of the coating before the baking of the coating. Wetting of the crucible with ethanol before the application could not prevent this effect. Also when 2% PVA Celvol E 04/88 (Celanese Emulsions GmbH) was added to the ethanol-silicon nitride suspension, no crack-free layer thicknesses of >250 μm could be achieved during an application by flooding. The oxygen content of the coating is found in Table 1, it was not possible to determine the hardness.

Comparative Example 2

Standard Suspension 50 wt. % of silicon nitride powder (UBE E10) is homogenized in ethanol. The suspension is applied to the cleaned, dust-free dry fused silica crucible. The coating is applied by spraying. It was found that a wet-on-wet spraying of the suspension is not possible since cracks are formed in the coating from a layer thickness of about 200 μm. The coatings are sprayed in powder form.

After drying the coatings are baked at about 1000° C. before being used as crucibles. The silicon nitride layer thus produced is only touch-proof to a certain degree and should be handled with appropriate care.

The adhesive strength of the coating is 0.18 N/mm$^2$, the hardness is 2 HBW 2.5/3 (see Table 1).

Comparative Example 3

A coating suspension was produced according to WO 2007/039310 A1, Example 1b. The coating was applied by powder spraying or flooding and baked at 500° C. (3a) and 750° C. (3b).

The coating is powdery after baking and not touch-proof. For the powder-sprayed coatings the oxygen content, the hardness and the adhesive strength of the coating are given in Table 1.

When the coating is applied by flooding, the coating already cracks during drying or baking at a layer thickness of >80-150 μm and becomes detached so that no adhesive strength could be measured here and it was also not possible to measure the hardness.

Comparative Example 4

A coating was prepared in accordance with DE 10 2005 050 593 A1. To this end 600 g of silicon nitride powder (H.C. Starck, M11 h.p., mean particle size $d_{50}$<1 μm measured using a Mastersizer 2000, Malvern) is dispersed in a mixture of 900 g of ethanol and 95 g of the binder Inosil S38, Inomat GmbH, Germany (having an $SiO_2$ solid content in the annealing residue of 33 wt. %) on a roller block in a PE vessel containing silicon nitride grinding balls for five hours. The suspension contains 38 wt. % of silicon nitride. The suspension is applied by flooding on a fused silica solar crucible with a layer thickness of 100 μm. After drying the layer is baked at 500° C. for 30 minutes. Table 1 gives the oxygen content, the hardness and the adhesive strength of the coating.

Comparative Example 5

A coating was prepared in accordance with DE 10 2005 050 593 A1. To this end 600 g of silicon nitride powder (H.C. Starck, M11 h.p., $d_{50}$<1 μm) is dispersed in a mixture of 800 g of ethanol and 190 g of the binder Inosil S38, Inomat GmbH, Germany (having an $SiO_2$ solid content in the annealing residue of 33 wt. %) on a roller block in a PE vessel containing silicon nitride grinding balls for five hours. The suspension contains 38 wt. % of silicon nitride. The suspension is applied by flooding on a fused silica solar crucible with a layer thickness of 100 µm. After drying the layer is baked at 500° C. for 30 minutes. Table 1 gives the oxygen content, the hardness and the adhesive strength of the coating.

Comparative Example 6

A coating was prepared in accordance with DE 10 2007 053 284 A1.

2450 g of Inosil S-B binder (Inomat GmbH having an $SiO_2$ solid content in the annealing residue of 33 wt. %), 1200 g of ethanol, 4580 g of silicon nitride UBE E10 and 200 g of PVB are homogenized with silicon nitride grinding balls in a PE container in the form of a suspension. The suspension is converted into granules by spray granulation. After annealing the granules in air at 450° C., annealing is carried out for one hour in the closed crucible at 900° C. 750 g of the annealed granules are homogenized in 500 g of ethanol with grinding balls and ground in the form of a suspension to an agglomerate size of 4 µm. The suspension is applied by flooding to a fused silica crucible having a layer thickness of 350 µm. The layer is dried in air and baked for one hour at 1125° C. in a gas-fired furnace with a heating and cooling time of 8 hours each. Table 1 gives the oxygen content, the hardness and the adhesive strength of the coating.

Reference Example 1

Binder-Free Coating 12 g of sodium silicate (8% solid, ultrapure) is precipitated by dropping whilst stirring vigorously in 462 g of ethanol. In the dispersion 1150 g of silicon nitride powder (HC Starck M11 h.p. coarse, $d_{50}$=1.9 µm, measured using a Mastersizer 2000, Malvern) is homogenized with silicon nitride grinding balls in a PE container on a roller block for 6 hours to produce the coating suspension. The doping with sodium is 200 ppm relative to the total oxygen content of the coating suspension. The total oxygen content of the suspension is 66 wt. %. The coating suspension is applied by one-off flooding to a fused silica crucible with a layer thickness of about 200 µm. The layer is dried for 24 hours in air and then baked for one hour at 1100° C. with a heating and cooling rate of 2.3° C./min. The coating is not touch-proof.

The total oxygen content of the coating is given in Table 1. It was not possible to measure the hardness of the coating since the baked coating had already detached from the substrate during the measurement. The adhesive strength could not be determined for the same reason.

Reference Example 2

Coating with Binder without Doping 1090 g of silicon nitride powder (HC Starck M11 h.p. coarse, $d_{50}$=1.9 µm, measured using a Mastersizer 2000, Malvern) is homogenized with silicon nitride grinding balls in 462 g of ethanol in a PE container on a roller block for 6 hours to produce the coating suspension. The coating suspension is formed by adding 174 g of Inosil S-P (Type Inosil S-P 38, Inomat, Germany) with 34.5 wt. % of resulting $SiO_2$ solid after drying and pyrolysis (annealing residue) and homogenization for a further 4 hours. The resulting $SiO_2$ solid content from the binder in the coating suspension is 5 wt. %. The total solid content of the suspension is 66 wt. % relative to the annealing residue of the binder (after drying and pyrolysis). The coating suspension is applied by one-off flooding to a fused silica crucible with a layer thickness of about 180 µm. The layer is dried for 24 hours in air and then baked for one hour at 1100° C. with a heating and cooling rate of 2.3° C./min. The coating is not touch-proof.

The total oxygen content of the coating is given in Table 1.

It was not possible to measure the hardness of the coating since the baked coating had already detached from the substrate during the measurement. The adhesive strength could not be determined for the same reason.

Reference Example 3

Comparative example 3 was repeated but the binder content was reduced to 4 wt. %. The coating was applied by powder spraying and baked at 500° C.

The total oxygen content of the baked coating is given in Table 1. The coating is not touch-proof. The hardness and adhesion of the coating could not be measured since the layer flaked during sample preparation.

Example 1

12 g of sodium silicate (8% solid, ultrapure) is precipitated by dropping whilst stirring vigorously in 462 g of ethanol. In the dispersion 1090 g of silicon nitride powder (HC Starck M11 h.p. coarse, $d_{50}$=1.9 µm, measured using a Mastersizer 2000, Malvern) is homogenized with silicon nitride grinding balls in a PE container on a roller block for 2 hours. The coating suspension is formed by adding 174 g of Inosil S-P (Type Inosil S-P 38, Inomat GmbH, 34.5 wt. % of resulting $SiO_2$ solid after drying and pyrolysis) and homogenizing for a further 4 hours. The resulting $SiO_2$ solid content from the binder in the coating suspension is 5 wt. %. The doping with sodium is 200 ppm relative to the total oxygen content of the coating suspension after pyrolysis of the binder. The total oxygen content of the suspension is 66 wt. % relative to the annealing state of the binder (after drying and pyrolysis).

The coating suspension is applied by one-off flooding to a fused silica crucible with a layer thickness of about 150 µm. The layer is dried for 24 hours in air and then baked for one hour at 1100° C. with a heating and cooling rate of 2.3° C./min. The coating is defect-free and not powdery.

Examples 2-23

Further examples according to the invention are prepared similarly to Example 1 with different fractions of binder and dopant and baked at different temperatures. The experimental results are shown in Table 1.

In Table 1 Examples Nos. 1 to 23 are according to the invention, Examples V1 to V6 are comparative examples and Examples R1 to R3 are reference examples.

The values given in Table 1 for binder content (content of $SiO_2$-based binder) and Na doping each relate to the coating suspension. In addition, Table 1 gives the respective baking temperature of the coating and the values measured on the baked coating for oxygen and sodium content as well as hardness and adhesive strength.

TABLE 1

| Example No. | Binder content [wt. %] | Na doping [ppm] | Baking temperature [° C.] | Na content [ppm] | Total oxygen content [wt. %] | Brinell hardness [HBW 2.5/3] | Adhesive strength [N/mm²] |
|---|---|---|---|---|---|---|---|
| 1 | 5 | 200 | 1100 | 6 | 4.9 | 29 | 0.92 |
| 2 | 2 | 150 | 1100 | 6 | 4.8 | 15 | 0.30 |
| 3 | 4 | 150 | 1100 | 4 | 4.6 | 20 | 0.47 |
| 4 | 5 | 50 | 300 | 30 | 1.7 | 12 | 0.39 |
| 5 | 5 | 50 | 500 | 26 | 1.9 | 14 | 0.22 |
| 6 | 5 | 50 | 750 | 22 | 2.1 | 15 | 0.38 |
| 7 | 5 | 50 | 1000 | 3 | 3.1 | 17 | 0.26 |
| 8 | 5 | 50 | 1100 | 2 | 4.5 | 26 | 0.16 |
| 9 | 5 | 120 | 1100 | 4 | 4.5 | 28 | 0.74 |
| 10 | 5 | 150 | 300 | 111 | 1.8 | 13 | 0.57 |
| 11 | 5 | 150 | 500 | 94 | 1.8 | 16 | 0.78 |
| 12 | 5 | 150 | 750 | 79 | 2.3 | 18 | 1.02 |
| 13 | 5 | 150 | 1000 | 6 | 3.6 | 22 | 0.71 |
| 14 | 5 | 150 | 1100 | 5 | 4.9 | 25 | 1.29 |
| 15 | 5 | 200 | 300 | 119 | 1.7 | 16 | 0.33 |
| 16 | 5 | 200 | 500 | 108 | 1.9 | 18 | 0.69 |
| 17 | 5 | 200 | 750 | 98 | 2.1 | 19 | 0.95 |
| 18 | 5 | 200 | 1000 | 9 | 3.9 | 28 | 0.71 |
| 19 | 5 | 350 | 1100 | 14 | 7.0 | 29 | 0.21 |
| 20 | 6 | 150 | 1100 | 4 | 4.7 | 28 | 0.71 |
| 21 | 3 | 150 | 1100 | 7 | 3.7 | 16 | 0.23 |
| 22 | 8 | 150 | 500 | 70 | 4.0 | 22 | 1.03 |
| 23 | 8 | 150 | 1100 | 7 | 4.2 | 30 | 1.69 |
| V1 | 0 | 0 | 1000 | n.a.*) | 2.8 | n.m.) | n.m.) |
| V2 | 0 | 0 | 1000 | n.a.*) | 2.8 | 2.0 | 0.18 |
| V3a | 15 | 0 | 500 | n.a.*) | 8.6 | 2.7 | 0.23 |
| V3b | 15 | 0 | 500 | n.a.*) | 8.9 | 3.0 | 0.27 |
| V4 | 5 | 0 | 500 | n.a.*) | 1.9 | 6.4 | 1.77 |
| V5 | 10 | 0 | 500 | n.a.*) | 2.8 | 8.0 | 0.64 |
| V6 | 15 | 0 | 1100 | n.a.*) | 9.2 | 6.7 | 0.56 |
| R1 | 0 | 150 | 1100 | 22 | 8.2 | n.m.) | n.m.) |
| R2 | 5 | 0 | 1100 | <1 | 4.0 | n.m.) | n.m.) |
| R3 | 4 | 0 | 500 | n.a.*) | | n.m.) | n.m.) |

*)Not analysed
**)Not measurable since layer was already detached before or during the measurement

The invention claimed is:

1. Shaped body comprising a substrate with a firmly adhering separating layer, wherein the separating layer comprises 92-98 wt. % silicon nitride ($Si_3N_4$) and 2-8 wt. % silicon dioxide ($SiO_2$) and wherein the separating layer has a total oxygen content of ≤8 wt. % and a hardness of at least 10 HB 2.5/3 according to DIN EN ISO 6506-1.

2. The shaped body according to claim 1, wherein the separating layer furthermore contains a residual content of a dopant in the form of a flux.

3. The shaped body according to claim 2, wherein the dopant comprises an alkali metal compound.

4. The shaped body according to claim 3, wherein the fraction of the dopant expressed as the alkali metal content of the separating layer is up to 150 ppm.

5. The shaped body according to claim 1, wherein the total oxygen content of the separating layer is <5 wt. %.

6. The shaped body according to claim 1, wherein the separating layer contains 94-98 wt. % $Si_3N_4$ and 2-6 wt. % $SiO_2$.

7. The shaped body according to claim 1, wherein the hardness of the separating layer is at least 15 HBW 2.5/3 according to DIN EN ISO 6506-1.

8. The shaped body according to claim 1, wherein the substrate consists of fused silica.

* * * * *